United States Patent
Huang

(12) 
(10) Patent No.: US 6,489,601 B1
(45) Date of Patent: Dec. 3, 2002

(54) CORRECTION METHOD FOR AN IMAGE READING SYSTEM

(75) Inventor: Yin-Chun Huang, Hsinchu (TW)

(73) Assignee: Umax Data Systems, Inc., Taiwan (CN)

( * ) Notice: Subject to any disclaimer, the term of this patent is extended or adjusted under 35 U.S.C. 154(b) by 0 days.

(21) Appl. No.: 09/349,541

(22) Filed: Jul. 9, 1999

(51) Int. Cl.$^7$ ............................................... H01L 27/00

(52) U.S. Cl. ..................... 250/208.1; 358/516; 358/504

(58) Field of Search ................................. 358/515–523, 358/461, 504; 250/208.1, 334, 335; 257/440, 291

(56) References Cited

U.S. PATENT DOCUMENTS 6,191,873 B1 * 2/2001 Mizoguchi et al. ......... 358/516

* cited by examiner

Primary Examiner—Frank G. Font
Assistant Examiner—Andrew H. Lee
(74) Attorney, Agent, or Firm—Baker Botts LLP

(57) ABSTRACT

The present invention proposes a method of white plate correction to minimize the width of a reference white plate in an image reading system. The correction method for an image reading system includes the major steps of: providing a reference plate for a reference level correction; reading through the image of the reference plate with line-by-line scanning of a scanning line, the scanning line having a plurality of image sensors arranged inline; picking up at least one peak value of scanned image of each of the image sensors; and correcting each of the image sensors employing corresponding the at least one peak value as a reference level.

14 Claims, 2 Drawing Sheets

CORRECTION METHOD FOR AN IMAGE READING SYSTEM

FIELD OF THE INVENTION

The present invention relates to a correction method for an image reading system, and more specifically, to a method of white plate correction or shading correction to minimize the width of a reference white plate in an image reading system.

BACKGROUND OF THE INVENTION

The electrical industry has been developed continuously as one of the most important industries in the twentieth century. With the fast progressing in various kinds of computing and processing system, lots of electrical devices including computers, communication devices, and consumer electronics are employed in our daily life. In recent years, the application of image processing apparatus, in combining with the raising processing and storage ability of the computing system or the processors, plays an vital role in image reading, processing, and transferring usage.

Generally, most of the image reading systems can be classified as two categories. The first category is a so-called stationary reading device category. In the first category of image reading systems, the image reading device or image reading head is kept stationary during the document reading process, and the document scanning operation is achieved through moving the originals bypassing the front end of the image reading device or the image reading head. The design is mostly seen on facsimile machines and sheet-feed scanners. The simplified design provides a image reading system with less structural parts and minimize the occupied volume of the whole system.

In contrast to the stationary reading device category, the second category is called as the moving reading device or dynamic reading device category. In the second category of image reading systems, the image reading device or image reading head is driven to move in parallel, or namely in a line-by-line scanning way, in front of the stationary objects which are scanned during the image reading process. The scanning operation is completed by moving the image reading device or image reading head through the whole reading area, such as an original sheet or an object being scanned. The design is generally employed in high-quality scanning systems like typical flat-bed scanning systems, in order to provide raised image quality by the stability in the scanning operation.

In either category of the scanning systems, a line or array of image sensors are provided to read the image with the illumination of a light source. In general, the light source of a fluorescent lamp, a single or more light emitting diodes (LED), or other light emitting device is employed to provide the scanned object with essential illumination and reflect the image on the object to the image sensors.

In the aforementioned scanning systems, the uniformity in the light source and the sensibility of the image sensors is a major basis for providing high quality and accurate image scanning. However, it is known that the uniformity of the both the sensors and light source is hardly provided in the mass-manufactured industrial products. Besides, the uniformity in the light source and the sensibility of the image sensors, especially the distribution and strength in the light source through out the scanning line, may also varied with each scanning operation and the extension of operating time under the factors such as temperature, operating scheme, and other factors.

For solving the uniformity problems and provide scanned with improved accuracy, most of the scanning systems has the design of performing a correction step every time the system starts up, or even before every scanning of originals. In general, a white plate is provided as a reference plate, which is scanned in the correction step, and the brightness of the plate is served as a reference value, or generally the defined most bright level, of the image scanned later. By providing each of the scanned pixel with the same reference level of the white plate, the non-uniformity in the light distribution and the sensibility of the image sensors can be corrected.

Without limiting the scope of the present invention, a flat-bed scanning system is taken as an illustrative example to describe the design of the white plate. FIG. 1 is an illustrative view from the underside of a glass plate in a flat-bed scanning system of the typical scanner design. The scanning area 10 occupies the major part of the scanner and the originals can be read through the transparent scanning area 10 of mostly highly-transparent glass. The white plate 12 is placed before the scanning area 10 and can also covered by the same transparent glass plate.

In the set up period or before the scanning operation, a image reading device, of which the scanned area 14 is indicated in the figure, is moved through the white plate 12 and generate image signal from the white plate 12 to be utilized as a reference level for white plate correction, or so-called shading correction by skilled artisans.

In the prior art designs, a certain width of the white plate 12, for example, two hundred pixels, must be presented for providing a sufficient reference basis in the white plate correction. In addition, an additional width of the white plate 12 is also needed to compensate the misalignment in the position or the angle of the white plate 12, which is frequently happened in the manufacturing process of scanning systems, as indicated in FIG. 1, or in some occasions to compensate the small deviation or misalignment in the opening of the image reading head. As an example, for a typical scanning system having a resolution of 300 dots per inch (DPI), the additional width to compensate the manufacturing tolerance can be about 0.85 centimeter, or about the length of 100 pixels.

Therefore, to cover up the manufacturing deviation and provide the white plate correction step with sufficient width of the white plate 12, a total width of 300 pixels, as an example, may be needed for the scanning system. In a scanning system with a resolution of 300 dots per inch (DPI), the minimize width of the white plate 12 is about 1 inch, or namely 2.54 centimeters. In the conventional flat-bed scanning system, a white plate of 2.54 centimeters in width is of reasonable value in terms of the space it occupied. However, with the downsizing of the scanning system, the width of the white plate 12 has become an unresolved issue in occupying too much space of the scanning system as well as requiring too much glass plate area.

Besides the problem of occupying too much area by the white plate, another problem might be encountered. If the misalignment, or namely the skew problem, of the white plate 12 is so severe, some regions uncovered by the skewed white plate may be scanned in the correction scanning. The incorrect level on brightness, when employed as the reference level of correction, causes the failure of correction and also results in the damage of image reading quality from level-misinterpretation.

SUMMARY OF THE INVENTION

The present invention proposes a method of white plate correction to minimize the width of a reference white plate in an image reading system. The correction method provides the same accuracy and quality with conventional white plate correction while at the same time reduces the white plate width, glass area, scanner volume without influencing manufacturing tolerance. Having the proposed approach, the skewed problem of damaging image scanning quality in the prior art is also eliminated.

The correction method for an image reading system includes the major steps of: providing a reference plate for a reference level correction; reading through the image of the reference plate with line-by-line scanning of a scanning line, the scanning line having a plurality of image sensors arranged inline; picking up at least one peak value of scanned image of each of the image sensors; and correcting each of the image sensors employing corresponding the at least one peak value as a reference level.

In the preferred embodiments, the reference plate is a white plate for performing a white plate correction. In some embodiments of scanning system with different designs and correction approaches, the correction step may include the steps of: duplicating the at least one peak value to a plurality of reference values; and correcting each of the image sensors employing corresponding the reference values of each of the image sensor as reference levels.

BRIEF DESCRIPTION OF THE DRAWINGS

The foregoing aspects and many of the attendant advantages of this invention will become more readily appreciated and better understood by referencing the following detailed description, when taken in conjunction with the accompanying drawings, wherein.

DETAILED DESCRIPTION OF THE PREFERRED EMBODIMENT

The present invention propose a correction method for an image reading system. The method provides an improved approach to the white plate correction and reduces the width and occupied space of the white plate. By picking the peak value of the scanned image as the reference level for correction, the white plate width can be minimized without damaging the accuracy of the correction. The minimized white plate with less occupied space therefore reduces the glass area and the volume of the scanning system such as a flat-bed scanning system. Having the proposed approach, the skewed problem of damaging image scanning quality in the prior art is also eliminated.

Figure 1:
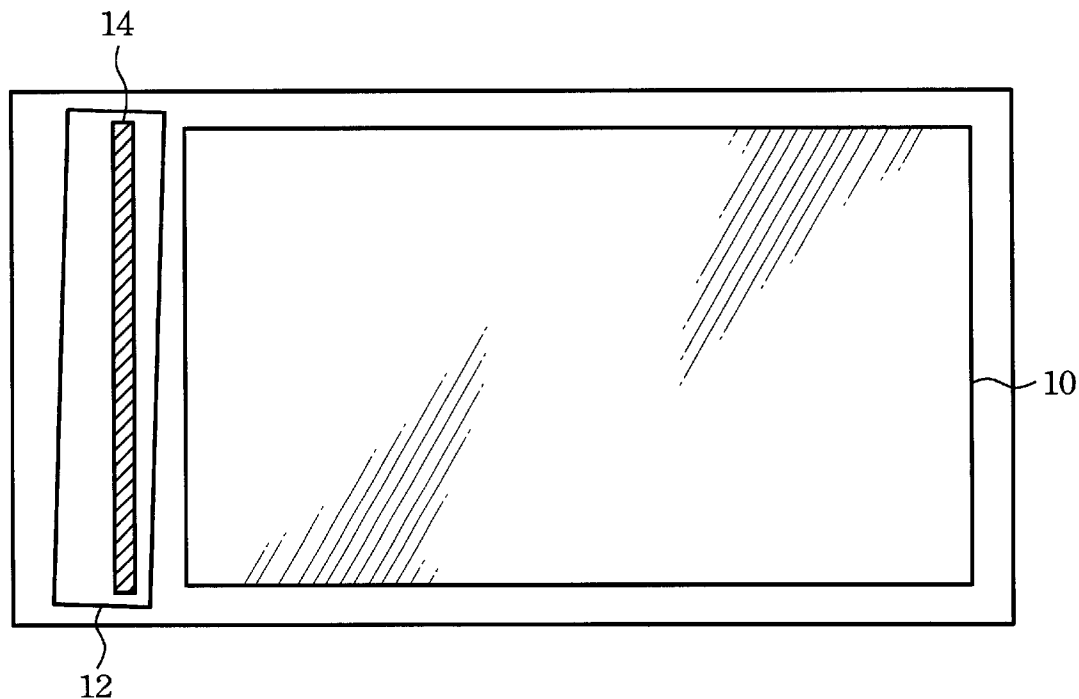
FIG. 1 is an illustrative view from the bottom-side of a glass plate in a flat-bed scanning system of the scanner design in the prior art.
Figure 2:
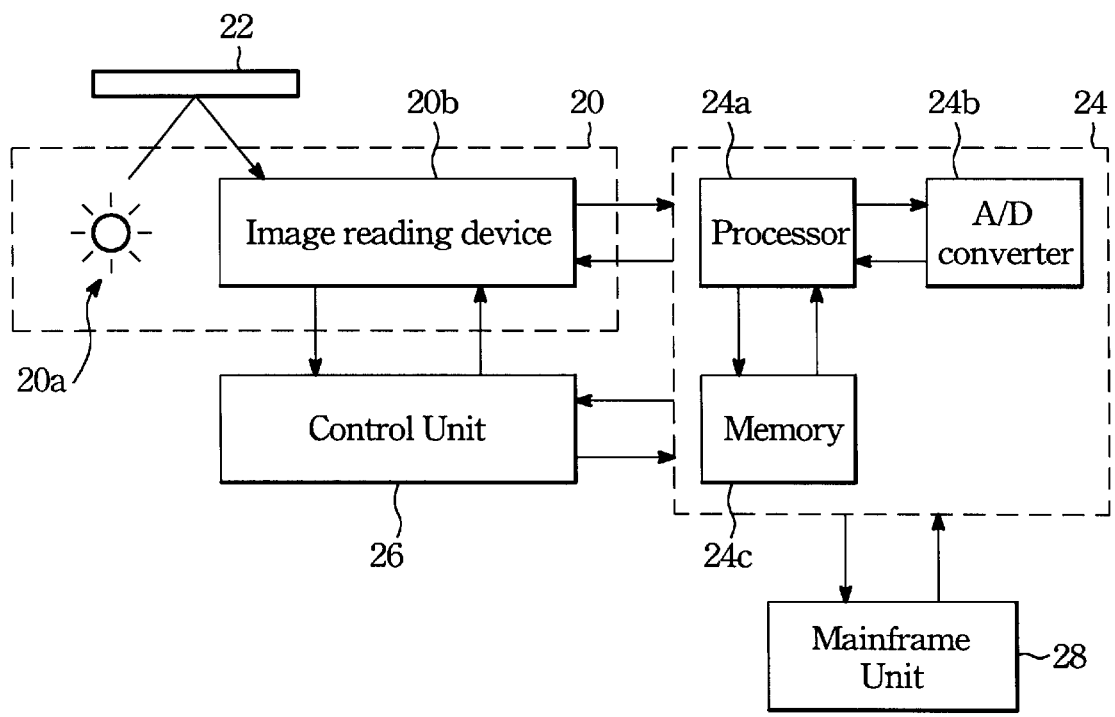
FIG. 2 is a schematic functional block diagram of a scanning system showing the major elements for performing the correction in accordance with the present invention.

Referring to FIG. 2, a schematic functional block diagram of a scanning system showing the major elements for performing the reference level correction is illustrated. As an example, a flat-bed scanning system is described as an illustrative example.

Typically, the flat-bed scanning system belongs to the so-called moving reading device category, as illustrated in the background of the invention. The flat-bed scanning system includes an image reading head 20, which may comprise a light source 20a and a image reading device 20b. In general, the light source 20a is a fluorescent lamp tube to provide a long illumination area where the scanning line of the image reading device 20b is located. In a A4 size flat-bed scanner, a fluorescent lamp tube having a length over 210 millimeters can be used. The image reading device 20b is mostly composed of charge-coupled devices (CCDs) with accompanying reflecting mirrors, focus lens, filters, or color-splitting prisms. For reading color images, the charge-coupled devices can be arranged in an array of at least three rows to read the image of separated colors, such as red, green and blue (RGB). Alternatively, the image reading head may also be a contact image sensor (CIS) module having embedded light source, image sensors, and controlling circuits.

For performing a correction, a reference plate 22 is provided. In the preferred embodiments, a white plate is given as the reference plate 22 to represent the most bright level and serve as a correction basis. A processing unit 24 is coupled with the image reading head 20 to process the read image signals. In the case, the processing unit 24 includes a processor 24a, an analog-to-digital (A/D) converter for converting analog image signals to digital image signals, and a memory 24c for storing data. A control unit 26 is coupled with the image reading head 20 and the processing unit 24 to control the moving of the image reading head 20 to scan through the reference plate 22, and also the other objects being scanned in the scanning operation. In general, the image data processed with the processing unit 24 is transferred to a mainframe unit 28.

Figure 3:
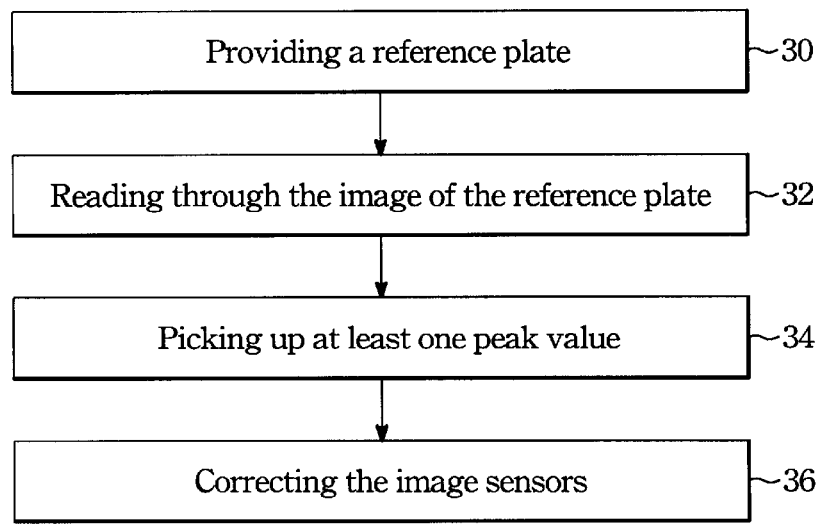
FIG. 3 illustrates a schematic flow diagram of the correction method in accordance with the present invention.

Turning to FIG. 3, a schematic flow diagram of the correction method in the present invention is shown. The first step 30 is performed to provide a reference plate, such as the reference plate or white plate 22 in FIG. 2, to serve as the basis for a reference level correction. In the preferred embodiments, the reference plate is provided with minimum width of 1 pixel, which is sufficient for the peak value picking and expanding approach in the method of the present invention. The width of the reference plate can be adjusted according to different needs without occupying too much additional space in the scanning system. In the case, the width of the reference plate can be between about 1 or 2 pixels to 50 pixels or more. The actual width of the reference plate can be calculated from the resolution of the scanning system.

Figure 4:
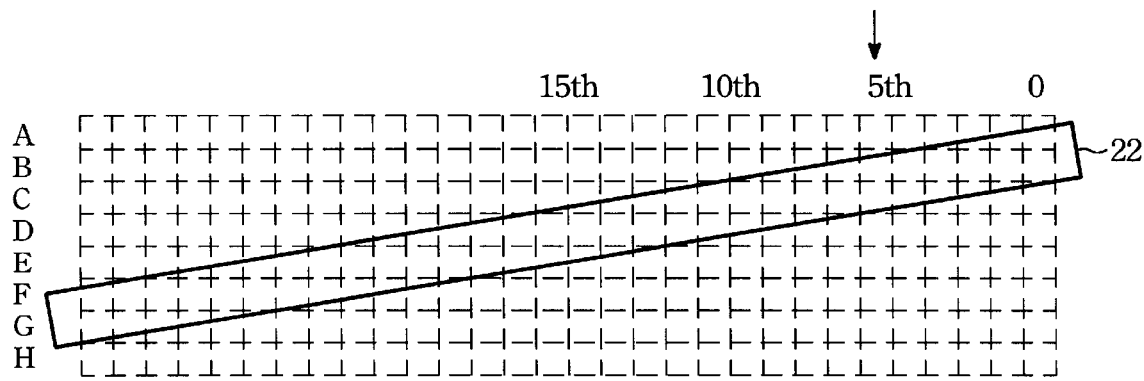
FIG. 4 illustrates a portion of the scanning area and a portion of the reference plate in accordance with the present invention.

Referring to FIG. 4, for a simplified and focused illustration, a portion of the scanning area and a portion of the reference plate 22 is shown. An exaggerated case is shown in which the reference plate is placed in a non-parallel, severely inclined position to the scanning line. The inclination of the reference plate mostly comes from the misalignment during the fabrication process of the scanning system.

In the step 32 of FIG. 3, the image of the reference plate is read through with line-by-line scanning of a scanning line. In general, the scanning line has a plurality of image sensors arranged inline to scan the image of the target region, generally one line for every forward scanning step. As illustrated in FIG. 4, the scanning line has a plurality of images sensors to scan the image, such as line A to line H, and the image in a line is split into a plurality of grids and read by individual sensors. In the illustrated portion of the reference plate 22, the image reading head has to read through line A to line G, in order to read through the occupied region of the reference plate 22. In the case, the image reading step 32 is performed until each of the image sensors has read through at least a portion of the reference plate 22.

In the step 34 of FIG. 3, after the reference plate is scanned, each individual image sensor has recorded a lot of pixels, and at least one peak value of scanned image recorded by each image sensor is picked up. As an example, the fifth sensor indicated FIG. 4 has passed through line A to line G, and a peak value is generated from the most strong reflection from the brightness of the reference plate, which is much brighter than other scanned regions. As an example, the image recorded at line C for the fifth sensor may be the brightest point and is identified as the peak value and picked up. In the illustrated scanning systems, the picking-up step can be performed by the operation and computation of the processing unit 24 in FIG. 2. If a wider width of the reference plate is provided, more than one peak value can be selected as the reference level to improve the accuracy and uniformity.

Finally, each of the image sensors, which may has non-uniformity in the read level under the different the sensibility and the illumination intensity of the light source, are corrected employing the corresponding one or more peak values as a reference level, as shown in step 36 of FIG. 3. Therefore, the white plate correction can be achieved using minimize width of the reference plate without damaging the correction accuracy and uniformity. The skew problem of damaging image reading accuracy is also eliminated.

In some scanning systems of different design, a certain width of reference pixels, such as 100 or 200 pixels, may be needed for performing a standard white plate correction. For complying with different kinds of scanning systems, the correction step 36 in the preferred embodiments includes two substeps. At first, the one or more peak values being picked are expanded, or namely duplicated, to a plurality of reference values, such as 100 or 200 reference values. The reference values can then be stored in a memory for correction usage. Next, each of the image sensor is corrected employing the corresponding reference values as reference levels.

As is understood by a person skilled in the art, the foregoing descriptions of the preferred embodiment of the present invention is an illustration of the present invention rather than a limitation thereon. It is intended to cover various modifications and similar arrangements included within the spirit and scope of the appended claims. The scope of the claims should be accorded to the broadest interpretation so as to encompass all such modifications and similar structures. While the preferred embodiment of the invention has been illustrated and described, it will be appreciated that various changes can be made therein without departing from the spirit and scope of the invention.

What is claimed is:

1. A correction method for an image reading system, said correction method comprising the steps of:

providing a reference plate for a reference level correction, said reference plate having a width between one pixel and fifty pixels;

reading an image of said reference plate on the basis of line-by-line scanning by using a scanning line, said scanning line having a plurality of image sensors;

picking up at least one peak value of each of said image sensors; and correcting each of said image sensors by employing corresponding said at least one peak value as a reference level.

2. The correction method of claim 1, wherein said reference plate comprises a white plate.

3. The correction method of claim 1, wherein said reference plate is placed in a non-parallel position to said scanning line.

4. The correction method of claim 1, wherein said image reading step is performed until each of said image sensors has read at least a portion of said reference plate.

5. The correction method of claim 1, wherein said image reading step is performed until each of said image sensors has read said reference plate.

6. The correction method of claim 1, wherein said at least one peak value of said image sensors is at least one brightest point responsive to the image of said white plate.

7. The correction method of claim 1, wherein said correction step comprising the steps of:

duplicating said at least one peak value to a plurality of reference values; and correcting each of said image sensors by employing corresponding said reference values of each of said image sensors as reference levels.

8. A correction method for an image reading system, said correction method comprising the steps of:

providing a white plate for a reference level correction, said white plate having a width between one pixel and fifty pixels;

reading an image of said white plate on the basis of line-by-line scanning by using a scanning line, said scanning line having a plurality of image sensors;

picking up at least one peak value of each of said image sensors;

duplicating said at least one peak value of each of said image sensors to a plurality of reference values; and correcting each of said image sensors by employing corresponding said reference values as reference levels.

9. The correction method of claim 7, wherein said white plate has a width narrower than 50 pixels.

10. The correction method of claim 8, wherein said white plate is placed in a non-parallel position in relative to said scanning line.

11. The correction method of claim 8, wherein said image reading step is performed until each of said image sensors has read at least a portion of said white plate.

12. The correction method of claim 8, wherein said image reading step is performed until each of said image sensors has read said white plate.

13. The correction method of claim 8, wherein said at least one peak value of said image sensors is at least one brightest point responsive to the image of said white plate.

14. The correction method of claim 13, wherein said white plate is placed in a non-parallel position in relative to said scanning line.

* * * * *